United States Patent [19]

Merchant

[11] 4,173,735
[45] Nov. 6, 1979

[54] CONTACT FAULT DETECTOR

[76] Inventor: Floyd S. Merchant, Box P25, R.D., Asbury, N.J. 08802

[21] Appl. No.: 897,785

[22] Filed: Apr. 19, 1978

[51] Int. Cl.$^2$ ............................................. G01R 31/02
[52] U.S. Cl. ..................................... 324/421; 324/420
[58] Field of Search ........... 324/28 R, 28 CH, 28 CR, 324/28 RS, 123 R

[56] References Cited

U.S. PATENT DOCUMENTS 4,104,578   8/1978   Thuot ............................... 324/28 CR Primary Examiner—M. Tokar
Attorney, Agent, or Firm—McAulay, Fields, Fisher & Goldstein

[57] ABSTRACT

A technique and a circuit is described for readily detecting contact resistance build-up and contact chatter. Closed contacts are arranged in series with each other and with a resistor. A voltage is applied across the series arrangement. Each contact is shorted by jumper lead and/or separately jolted. If the contact is defective, the voltage step or series of voltage pulses will appear at the junction between the resistor and the contacts in series. The voltage step or pulses are coupled through a capacitor to a normally on switch which changes state to indicate the presence of the pulse indicating the defective contact. A resistor coupled to the capacitor provides a differentiating circuit to bleed off any charge in the capacitor to permit sequentially testing each contact. A further resistor in combination with the capacitor provides an integrating circuit to assure appropriate capacitor charging in response to the negative going pulses that occur when there is contact chatter.

14 Claims, 3 Drawing Figures

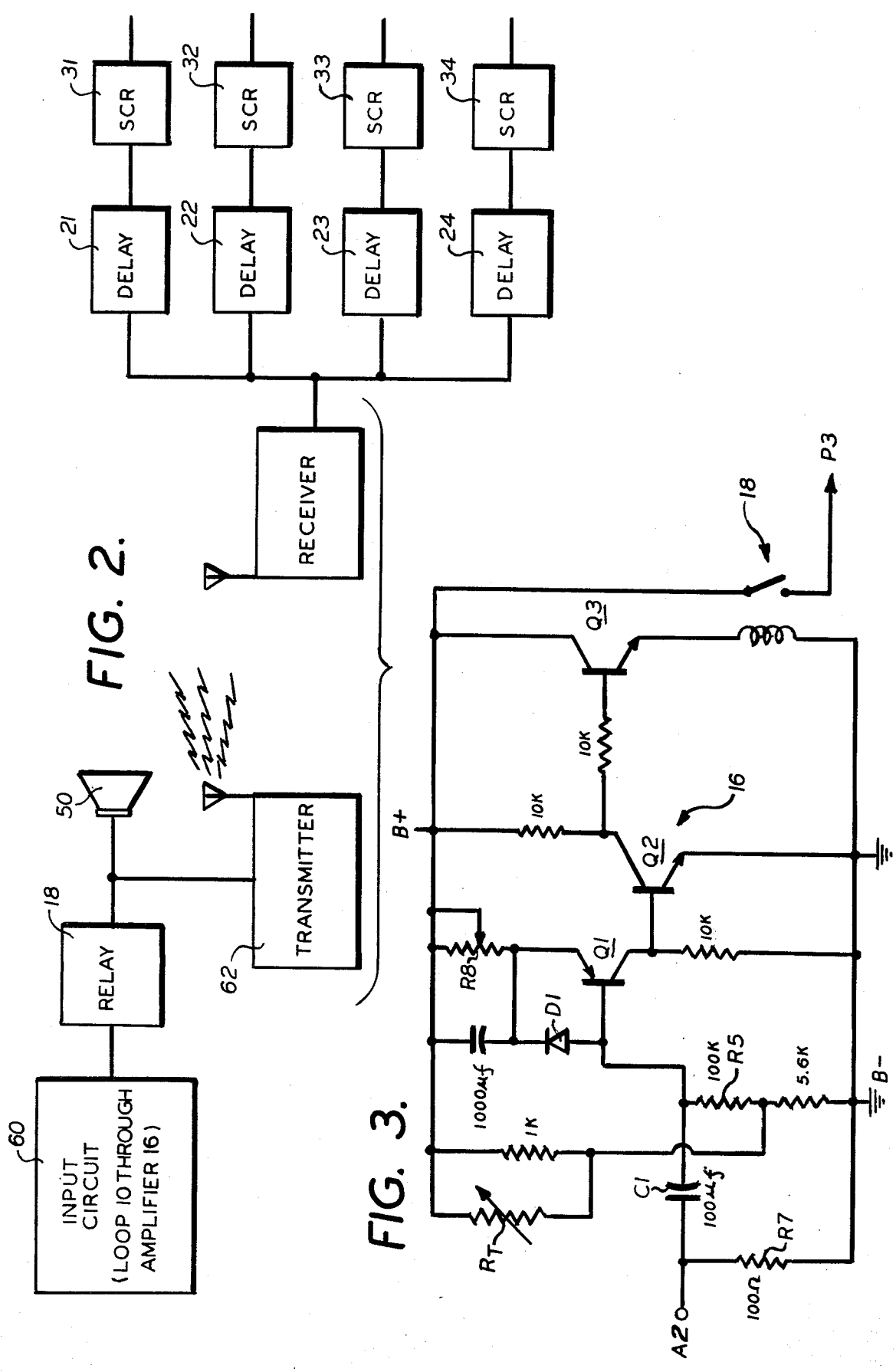

CONTACT FAULT DETECTOR

BACKGROUND OF THE INVENTION

In the field testing of contacts employed in such circuits as intrusion alarm circuits, a major problem arises in connection with contacts that gradually deteriorate. Resistance builds up. The contacts become loose. Either of these defects increase the incidence of false alarm. Field testing of these contacts is difficult and time consuming. Yet the value of an alarm system is a function of the maintenance that is given the alarm system. If the cost of maintenance becomes prohibitive, there is a tendency to allow the alarm system to deteriorate and thus become much less useful.

Accordingly, it is a major purpose of this invention to provide a simple and sure system of checking for defective contacts in the field particularly in equipment such as intrusion alarms.

It is a further purpose of this invention that the faulty contact detecting equipment be simple to use and easy to maintain so that it is relatively inexpensive. Furthermore, it is important that such equipment permit ready use in situations where the contact being tested is in a relatively inconvenient place. For example, the contact might be placed on a window frame that is a considerable distance from the floor and that requires a ladder for access to it. In such a case, it is important that the maintenance person be able to quickly and simply check for the defects without having to make a lot of adjustments or engage in significant calculations during the testing process. Accordingly, it is a purpose of this invention to provide a fault detector that is simple to use and provides relatively unambiguous indications of faulty conditions.

The two major ways in which a contact slowly develops faulty operation is through the buildup of resistance across the contact and through increasing susceptibility to being temporarily open when vibrated or subjected to shock. Accordingly, it is a further purpose of this invention to provide a fault detection system which will detect both of these faulty conditions.

BRIEF DESCRIPTION

In brief the contact fault detector of this invention involves a technique of detecting a small signal that is induced when a defective contact it tested. The set of contacts are connected in a closed state in series with each other and in series with a resistor. A predetermined voltage is applied across this series. The voltage at the junction between the set of contacts in series and the resistor is applied to an input end of a capacitor. The output of the capacitor is applied as the input signal to a normally on switching transistor. When on, the transistor operates to clamp the output side of the capacitor at the base voltage of the transistor. If a small sharp voltage increase occurs at the input side of the capacitor, it is coupled through to the switching transistor to turn off the switching transistor and therefore provide a signal indicating the existence of the sharp change.

To test for contact resistance build-up, each contact in sequence is shorted out by having a jumper lead applied across the contact. If the contact has substantial resistance, a small sharp voltage increase will be sensed at the input side of the capacitor and will cause the switching transistor to change state indicating the existence of a defect. A resistor to ground at the output end of the capacitor assures that the capacitor voltage will bleed off in a number of seconds so that the contact can be tested. The greater the resistance build-up, the greater will be the sharp voltage jump in shorting the defective contact. Since the switch will be turned off for a period of time that is a function of the voltage pulse, the circuit provides a measure of the seriousness of the resistive contact defect.

To test for a loose contact defect, the surface on which the contact is mounted is jolted. If the contact is defective, it will bounce to produce a series of brief contact openings and thus a series of bounce pulses. Each bounce pulse will cause the voltage at the input side of the capacitor to drop because opening of the contact opens the series circuit. Each bounce pulse can be considered a negative pulse by contrast with the positive pulse caused during the resistance test. The leading edge of each bounce pulse will cause a negative charging of the input side of the capacitor and at the end of the bounce pulse, the capacitor suddenly will be restored. The restoration edge is a positive going edge which is transmitted through the capacitor to the transistor switch to turn the transistor off. Because the transistor is turned off, it no longer clamps the output side of the capacitor. Accordingly the next bounce pulse causes the output side of the capacitor to immediately drop to the turn-on value of the transistor switch. The input side of the capacitor also immediately drops a like amount and then, because the output side is clamped, continues to charge negatively exponentially through the duration of the second bounce pulse. At the termination of the second bounce pulse, there is a restoration pulse which again is transmitted through the capacitor to turn off the switch and establish at the output of the capacitor a higher voltage level. This is repeated for each bounce pulse thereby essentially creating a cumulative voltage value at the output side of the capacitor. Accordingly, at the end of the sequence of bounce pulses, the transistor switch will be turned off for a period of time that is a function of the cumulative duration of all the bounce pulses and thus the circuit provides a measure of how serious is the loose contact defect.

BRIEF DESCRIPTION OF THE DRAWINGS

FIG. 2 is a block diagram of a second embodiment of this invention. The FIG. 2 embodiment is similar to the FIG. 1 embodiment except that in the FIG. 2 embodiment the indicator portion of the test equipment is physically removed from the test portion and the two portions are coupled by a radio signal instead of by a line.

FIG. 3 is an electrical schematic of the input detecting circuitry and associated amplifiers which form a portion of both the FIG. 1 and FIG. 2 system.

DESCRIPTION OF THE PREFERRED EMBODIMENTS

Figure 1:
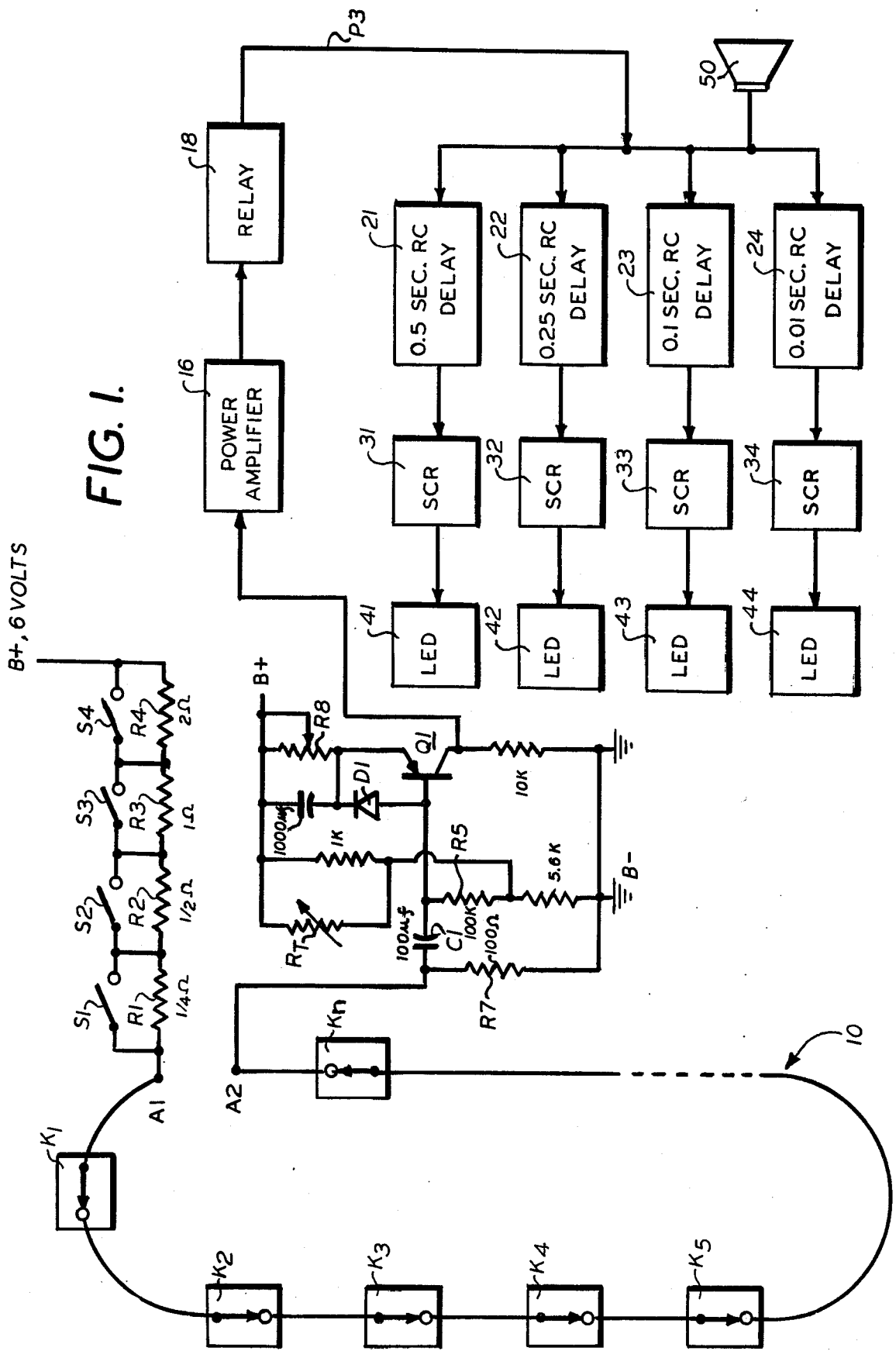
FIG. 1 is a block and schematic diagram of a first embodiment of this invention indicating the fault detector device connected to a set of normally closed contacts in series.

FIGS. 1 and 2 represent two embodiments which in most respects are similar to one another so that the same reference numbers are used to indicate the comparable parts of the two embodiments.

With reference to the FIG. 1 block and schematic diagram, the test circuitry (to the right of the terminals A—A) is connected in series with a multi-switch, K1, K2 ... Kn series circuit through which a supervisory current normally flows from B+ to B−. This supervisory current might be in the order of five milliamps. In normal alarm system operation, when a contact K is opened (and thus the series circuit is broken) this five milliamp current stops and the result is a signal change at a sensing element (not shown) which ultimately turns on an alarm (also not shown).

To test whether or not there are potential defects in the various contacts K in the multi-contact loop 10, the loop 10 is opened at a convenient place usually at the terminals where the alarm control panel is connected. Input leads A—A of the testing circuit are connected at these terminals. The battery connections are also changed to be as shown. When connected as shown in FIG. 1, the current will flow through the resistors R1, R2, R3, R4, the multi-contact series loop 10 and the resistor R7, all in series. With a six volt battery, the current would be in the range of 60 milliamps, as an example.

In use, a jumper is placed across each of the contacts K1, K2 ... Kn, in sequence, thereby shorting out each contact individually. Obviously if the contact element has no resistance there will be no effect on the circuit and nothing will be noticed. However, if the contact element has any resistance, and thus might be on the road to becoming defective, there will be a sudden slight increase in the voltage at the resistor R7 and capacitor C1. This voltage step will be coupled through the capacitor C1 to appear as a positive input at the switch Q1 thus turning the switch Q1 off. The switch Q1 will turn back on again when the charge on the capacitor C1 leaks off through the resistor R5 to a point below the turn-on voltage at the base of the transistor Q1. Thus the duration of the turn-off of the transistor Q1 will be a function of the amplitude of the input voltage step at the terminal A2.

The amplifier 16 is the transistors Q2 and Q3 and associated circuitry shown in FIG. 3. The amplifier 16 is designed to function as an inverting switch. Transistor Q2 provides power gain and inverts. Its state is normally on. When the transistor Q1 turns off, the collector voltage of Q1 drops, thereby dropping the voltage at the base of the transistor Q2 to turn the transistor Q2 off. The transistor Q2 is off as long as the transistor Q1 if off. Thus, transistor Q2 provides an output signal that is a pulse whose duration is a function of the amplitude of the input voltage step or pulse at the terminal A2.

Transistor Q3 provides an additional stage of power amplification. Since it is in the emitter follower configuration, its output waveform is almost identical to that of transistor Q2.

This output pulse from the amplifier 16 turns on the relay 18 thereby providing an input pulse P3 from the battery B+ to the four delay circuits 21,22,23,24. If the pulse P3 has a duration of, for example, 0.2 seconds, then the delay circuits 23 and 24 will pass a signal to the gates of SCRs 33 and 34 thereby lighting the diodes 43 and 44. The delay circuits 21 and 22 will block the signal. In this fashion, the ones of the diodes 41,42,43 and 44 that light will provide an indication of pulse duration. For example, if all four diodes light, then the pulse duration is greater than 0.5 seconds. If only diode 44 lights, then the pulse duration is between 0.01 and 0.1 seconds. The SCRs when turned on, latch, so that the visual indication remains.

The duration of the pulse P3 is a function of the amplitude of input step voltage applied to the capacitor C1. The amplitude of that step voltage is a function of the resistance across the contact Ki being tested. Thus the LED light pattern can be correlated to contact resistance. The contacts Ki can be checked for any desired resistance level and replaced when found to exceed that level. The greater the resistance build up, the greater will be the sharp voltage jump in shorting the defective contact. Since the switch will be turned off for a period of time that is a function of the voltage pulse, the circuit provides a measure of the seriousness of the resistive contact defect.

The resistor R5 is essential to make sure that the pulse applied to the capacitor C1 bleeds off sufficiently fast so that the transistor turns on in time for the next contact to be tested and the resultant pulse, if any, detected through the capacitor C1. In this fashion, the capacitor C1 and the resistor R5 operate as a differentiating network to reset the test circuit and to enable each contact to be tested in turn.

The delay circuits 21–24, although indicated with a nominal delay value, are in fact circuits with an adjustable delay value. The gain of the amplifier Q1 is adjustable as indicated by the variable emitter resistor R8. Between adjustments of the amplifier Q1 gain and adjustments of the delay provided at each delay circuit, a calibration procedure can be followed in which a change of contact circuit resistance, represented by the closing of an appropriate one of the switches S1-S4, will result in a particular pattern of diodes 41–44 being lit.

For example, in one adjustment setting, the closing of the switch S1 simulates a drop in circuit resitance of 0.25 ohms and results in the lighting of the diode 44. The closing of the switch S2 simulates a drop in curcuit resistance of 0.5 ohms and results in the lighting of the diodes 43 and 44. The closing of the switch S3 simulates a circuit resistance drop of one ohm and results in the lighting of the diodes 42, 43 and 44. Finally, the closing of the switch S4 simulates a drop in circuit resistance of two ohms and results in lighting of all of the diodes 41–44. Thus when so adjusted, then in use, when all four diodes light up, one knows that the contact resistance is at least two ohms. When the three diodes 42, 43 and 44 light up, one knows that the contact resistance is under two ohms but greater than one ohm. When the two diodes 43 and 44 light up, one knows that the contact resistance is greater than 0.5 ohm and less than one ohm. When only the diode 44 lights, one knows that the contact resistance is less than 0.05 ohm and greater than 0.25 ohm. When none of the diodes light up, one knows that the contact resistance is less than 0.25 ohms.

The above procedure can be varied by adjusting R8 (the emitter resistor of Q1) to modify the sensitivity of Q1. As a result, the diodes 41–44 which light up in response to a given change in resistance can be varied. In general, the resistor R8 can be adjusted in order to provide an optimum display as a function of the level of resistance changes it is desired to detect.

It is sometimes useful for the existence of a defective contact to be indicated aurally to the tester and for that purpose a small horn 50 might be connected to the relay 18.

The second routine of testing for which this fault tester can be employed is one that tests whether or not each individual contact Ki is subject to momentary openings when vibrated, shocked or jolted. Contacts which are subject to such momentary openings have a tendency to generate false alarms. If this tendency to momentary opening in response to such jolting is detected at an early stage, the false alarm problem can be minimized. The procedure followed is for the maintenance person to slap or pound the element or panel on which the contact being tested is mounted. If the contact is defective because it does not hold its closed state continuously and consistently while being so jolted, a series of small negative pulses (bounce pulses) are generated. Each time the contact opens for a moment, the voltage of the terminal A2 drops.

More specifically, what occurs is that when a contact opens momentarily, the input side of capacitor C1 exponentially declines toward ground. The decline will be for such a short time that the drop in voltage on the input side of capacitor C1 may be only a few millivolts on a base level of $5\frac{1}{2}$ volts, for example. When the contact closes again, the input voltage of the capacitor C1 immediately jumps those few millivolts up to its normal level thereby providing a few millivolts of positive going step on the output side of the capacitor C1. This step is sufficient to turn off the switching transistor Q1 so that the charge in the capacitor C1 is held. It is true that the capacitor C1 then starts to discharge through the resistor R5. But that discharge is relatively slow compared to the repetition rate of the series of bounce pulses due to the chattering of the contact being tested when that contact is being jolted. On the second bounce pulse, the transistor Q1 is off so that the capacitor C1 is not being clamped. The capacitor C1 responds to the leading edge of the negative going pulse by immediately dropping the base input to the transistor Q1 to its turn-on value. The input side immediately drops a like amount, after which the input side of capacitor C1 continues to drop in voltage level through the resistor R7 until the switch contact again closes.

What happens with each chatter or bounce pulse, is that the output side of the capacitor C1 goes to a new higher level so that on the next succeeding bounce pulse, the drop to the conduction point of the transistor Q1 is greater and thus the drop on the input side of the capacitor is instantaneously greater. The input side of the capacitor then goes along an RC charging curve until that bounce pulse is terminated. The instantaneous jump in voltage is then the sum of the additional charge due to the immediately preceeding bounce pulse and all of the preceeding voltage charges thereby providing a still larger pulse through the capacitor C1.

In order to understand the functioning of this capacitor to "integrate" over the series of bounce pulses, it should be kept in mind that when the switching transistor Q1 is on, it establishes a base voltage which clamps the output side of the capacitor C1. But when the transistor Q1 is in its off state, the capacitor is not clamped and thus a sharp voltage change at the input side of the capacitor will be reflected as an immediate sharp voltage change at the output side of the capacitor. It should also be realized that when the capacitor is clamped (i.e., Q1 is on) a sharp downward voltage change at the input side of the capacitor results in a time constant dependent charging of the capacitor. Thus the circuit has two states which are a function of the state of the switching transistor Q1. These two states can be considered the charging state (when transistor Q1 is in its on state) and the instantaneous state (when the switching transistor Q1 is in its off state). With that understanding, it should further be recognized that the resistor R8 is adjusted to provide any desired degree of sensitivity for the transistor Q1 so that the transistor Q1 can be turned off by a pulse of a few millivolts. Thus when a rising edge of the pulse is applied to the input side of the capacitor, it will tend to turn the transistor off. Similarly when the transistor has been turned off, a falling edge of a pulse will tend to turn the transistor on.

Not every detected contact resistance and not every bounce pulse reflects an unacceptable contact. By varying the emitter resistor R8 of the transistor Q1, the level at which an indication is obtained on the LEDs 41–44 may be varied. Thus the information provided to the operator can be adjusted as desired. The operator can then use the indicated information in order to decide how urgent the problem is and when it is or may be necessary to take corrective action.

Throughout the testing procedure the fault tester may be kept in one location and only the jumper is moved. Specifically, by virtue of this invention, one can test a contact without having to carry equipment up a ladder or into crawl spaces.

However if it is desired to have the LED 41–44 indication immediately available to the testing person, the FIG. 2 embodiment may be useful. FIG. 2 illustrates an alternate version of the circuit. The block labelled input circuit 60 simply represents exactly what is shown in FIG. 1 from the switch loop 10 through the power amplifier 16. The output from the relay 18, however, is applied to modulate an oscillator in a simple transmitter circuit 62. The pulse outputs from the transmitter are then picked up by a receiver 64 and are then processed through delay circuits 21–24, SCRs 31–34 and diodes 41–44 exactly as described above. The advantage of this arrangement is primarily to permit a simple electronic pack to be carried by the tester to indicate the existence of the fault as the individual climbs a ladder or otherwise obtains access to the various locations where these switch contacts K1–Kn may be located. Specifically, the portable pack is the receiver 64, delays 21–24, SCRs 31–34 and LEDs 41–44.

What I claim is:

1. A contact fault detector comprising:
   first and second input leads for connecting in series with one or more contacts to be checked,
   an amplifier having an input and an output,
   a capacitor having an input side and an output side, said input side being connected to said first input lead and said output side being connected to said input of said amplifier,
   a first resistor connected to said input side of said capacitor to provide a voltage reference,
   a second resistor connected to said output side of said capacitor to provide a voltage bleed off function for said capacitor,
   said amplifier being responsive to the amplitude of any voltage step applied to said capacitor to provide an output indicative of said amplitude, and
   detection and indicating means responsive to said output of said amplifier to provide an indication of said amplitude of the voltage step applied to said capacitor.

2. The fault detector of claim 1 further comprising
   clamping means having an on state and an off state at said output side of said capacitor to provide a reference voltage at said output side when said clamping means is in said on state,
   said first resistor and said capacitor providing an integrating function, said clamping means being switched from its on state to its off state by a positive going voltage step at said first input lead.

3. The fault detector of claims 1 or 2 wherein: said second resistor and said capacitor provide a differentiating function.

4. The fault detector of claims 1 or 2 wherein: the time constant provided by said second resistor and said capacitor provides an input signal for said amplifier whose duration is a function of the amplitude of whatever voltage step is applied to said first lead and wherein said indicating means is responsive to the duration of an output pulse from said amplifier, thereby providing a measure of the amplitude of said input voltage step.

5. The fault detector of claims 1 or 2 wherein:
said amplifier is responsive to the amplitude of an input pulse to provide an output pulse having a pulse width that is a function of the amplitude of the input pulse and,
said detection and indicating means are responsive to the duration of said output pulse to provide an indicator signal whenever said output pulse has a duration greater than a predetermined value.

6. The contact fault detector of claim 3 further comprising:
a plurality of reference resistors in series with said contacts and said first resistor, and
a plurality of shorting switches, one each of said switches connected across a respective one of said reference resistors.

7. The contact fault detector of claim 6 further comprising: means to adjust the sensitivity of said amplifier.

8. The fault detect of claim 3 further comprising:
radio transmitter means to transmit the output of said amplifier by radio, and
radio receiver means coupled to said radio transmitter means to receive the output of said amplifier and to apply said output of said amplifier to said detection and indicating means.

9. A contact fault detector for detecting faulty contacts in a circuit where a continuous predetermined current is passed through whatever contact or contacts are to be tested connected in a series comprising:
first and second input leads to be connected in series with said contact or contacts,
an integrating circuit connected to said first input lead to provide a first fault indication signal when a defective contact is jolted,
a differentiating circuit connected to said first input lead to provide a second fault indication signal when a defective contact is shorted out,
amplifying means responsive to said first and second fault indication signals to provide an output signal indicative of said fault indicating signals and
detection and indicating means responsive to said output of said amplifier means to provide indication of the existance of said fault when said fault indicator signals exceed a predetermined threshold.

10. The method of detecting resistance build-up in normally closed contacts connected in series comprising the steps of:
connecting said contacts with a first resistor to form a series circuit,
applying a voltage across said series circuit,
shorting one of said contacts with a jumper,
coupling the resulting voltage step at a junction between said contacts and said first resistor through a capacitor to a means of measuring the amplitude of said voltage step,
bleeding off the charge on said capacitor through a second resistor, and
removing said jumper from said one of said contacts.

11. The method of detecting contact bounce in normally closed contacts connected in series comprising the steps of:
connecting said contacts with a first resistor to form a series circuit,
applying a voltage across said series circuit,
mechanically jolting one of said contacts,
accumulating the resulting pulse train at a junction between said contacts and said first resistor as a change in the voltage level at the input side of a capacitor,
coupling said change in voltage level to the output side of said capacitor, and
measuring said change in voltage level at said output side of said capacitor.

12. The method of detecting faulty contacts in normally closed contacts connected in series comprising the steps of:
connecting said contacts with a first resistor to form a series circuit,
applying a voltage across said series circuit,
shorting one of said contacts with a jumper,
coupling the resulting voltage step at a junction between said contacts and said first resistor through a capacitor to a means of measuring the amplitude of said voltage step,
bleeding off the charge on said capacitor through a second resistor,
removing said jumper from said one of said contacts,
mechanically jolting one of said contacts,
accumulating the resulting pulse train at said junction between said contacts and said first resistor as a change in the voltage level at the input side of said capacitor, and
coupling said change in voltage level through said capacitor to said amplitude measuring means,
said sequential steps of jolting, accumulating and coupling being taken during a separate time span from said sequential steps of shorting, coupling, bleeding and removing.

13. The method of detecting faulty normally closed contacts comprising the steps of:
passing a continuous predetermined electric current through the contact or contacts to be tested connected in series,
momentarily shorting across a contact to be tested,
detecting the leading edge of any sharp voltage pulse due to the shorting out of any resistance that may exist in the contact being tested, by use of a differentiating circuit, to provide a first fault indicator signal,
mechanically jolting said contact being tested,
detecting the trailing edge of whatever sharp decreases in current level are caused by said step of jolting, by use of an integrating circuit, to provide a second fault indicator signal, and
providing an indication of a faulty contact when any one of said indicator signals exceeds a predetermined threshold.

14. The method of step 13 further comprising repeating said steps of shorting and jolting for each contact in a set of contacts in series.

* * * * *